United States Patent [19]

Chang et al.

[11] 4,173,763
[45] Nov. 6, 1979

[54] HETEROJUNCTION TUNNELING BASE TRANSISTOR

[75] Inventors: Leroy L. Chang, Mohegan Lake; Leo Esaki, Chappaqua, both of N.Y.

[73] Assignee: International Business Machines Corporation, Armonk, N.Y.

[21] Appl. No.: 805,055

[22] Filed: Jun. 9, 1977

[51] Int. Cl.² .................. H01L 29/267; H01L 29/88
[52] U.S. Cl. ..................................... 357/12; 357/16; 357/20; 357/33; 357/34; 357/56
[58] Field of Search .................. 357/12, 16, 34, 33

[56] References Cited

U.S. PATENT DOCUMENTS

| | | | |
|---|---|---|---|
| 3,209,215 | 9/1965 | Esaki | 357/16 |
| 3,211,970 | 10/1965 | Christian | 357/16 |
| 3,225,272 | 12/1965 | Cronemoyer | 357/12 |
| 3,254,278 | 5/1966 | Kaye | 357/12 |
| 3,358,158 | 12/1967 | Tiemann | 357/12 |
| 3,417,248 | 12/1968 | Hall | 250/211 J |
| 3,459,967 | 8/1969 | Tammers et al. | 307/258 |
| 3,482,306 | 12/1969 | Shepherd, Jr. | 29/587 |
| 3,484,657 | 12/1969 | Madoian et al. | 357/12 |
| 3,821,777 | 6/1974 | James | 357/39 |
| 3,864,721 | 2/1975 | Cohen | 357/17 |
| 3,943,554 | 3/1976 | Russell et al. | 148/1.5 |
| 3,995,303 | 11/1976 | Nahory | 357/30 |

OTHER PUBLICATIONS

Milnes et al., Heterojunctions and Metal–Semiconductor Junctions, Academic Press, N.Y., 1972, pp. 1–93.

*Primary Examiner*—William D. Larkins
*Attorney, Agent, or Firm*—Jackson E. Stanland

[57] ABSTRACT

Device having three semiconductor regions, which can be characterized as the emitter, base and collector regions. The emitter and collector regions have a first conductivity type, and the base region has the opposite conductivity type, where both the base-emitter and base-collector junctions are heterojunctions. The base region is sufficiently thin that charge carriers can tunnel therethrough. The base region has a small resistance due to its heavy doping (which is greater than the doping of both the emitter and the collector). Both the valence band and the conduction band in the emitter and collector regions are shifted in the same direction with respect to the valence band and conduction band of the base region (i.e., the energy gaps of the emitter and collector are shifted in the same direction with respect to the energy gap of the base region and overlap with the energy band of the base to produce band-edge discontinuities $\Delta E_c$ and $\Delta E_v$). Any materials yielding the proper energy band diagram can be used; for example, Si-GaP and alloys of GaAsSb-InGaAs are particularly suitable.

44 Claims, 25 Drawing Figures

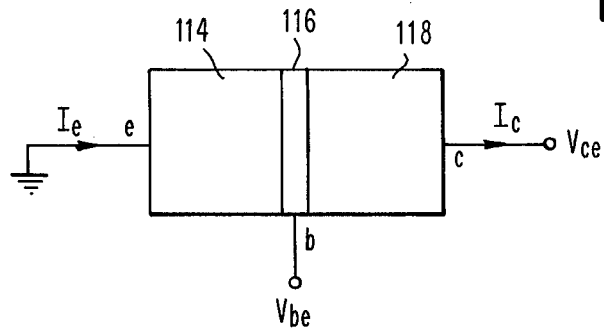
FIG. 8
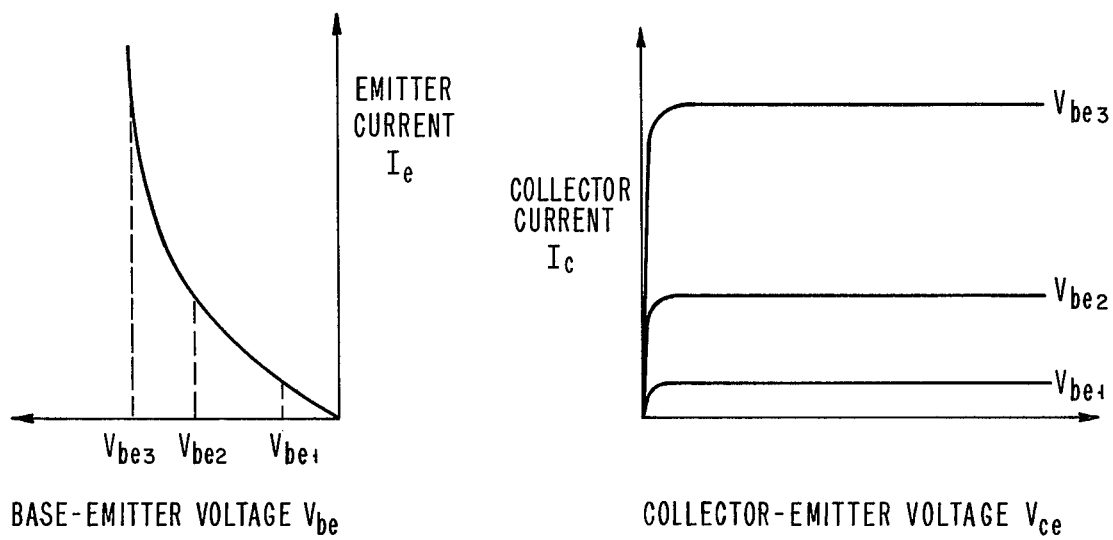
FIG. 9
FIG. 10

HETEROJUNCTION TUNNELING BASE TRANSISTOR

The invention was made under a Government Contract with the Department of Defense, Army Research Office.

BACKGROUND OF THE INVENTION

1. Field of the Invention

This invention relates to high speed semiconductor devices, and more particularly to a heterojunction transistor-like structure utilizing tunneling as the primary mechanism for charge transfer through the base region of the device.

2. Description of the Prior Art

Conventional semiconductor transistors operate on the principle of transfer of charge carriers from the emitter region of the transistor to the collector region of the transistor, where the charge carriers are injected into the base region and diffuse to the collector. The injected carriers are minority carriers when they are in the base region so that, in the case of a p-type base region, the injected carriers are electrons while, in the case of a n-type base region, the injected carriers are holes. In order for such a device to operate, these minority carriers in the base region must traverse the entire thickness of the base having opposite conductivity type and be collected on the other side at a collector electrode. The transport of these carriers is determined by their diffusion and by drift. Diffusion is both inherently slow and dependent on temperature, and is generally faster at higher temperatures and slower at lower temperatures. The transit time for the carriers in passage across the base region in an inherent limitation on the high frequency operation of these devices, when used as amplifiers, oscillators, or storage devices and minority carrier storage effects in the base region adversely affect operation of transistors as switches.

In the conventional semiconductor transistor, the frequency response is affected by the equivalent base resistance of the device. This in turn is determined by the resistivity of the semiconductive material and the thickness and cross-sectional area of the base region. In the prior art, various attempts have been made to reduce the base resistance and thickness of the base region. For example, the base region has been heavily doped to lower its resistivity, but this can produce an undesirable lowering of the lifetime of the minority carriers in the base region and a corresponding decrease in the transport factor $\alpha$ of the transistor, which results in low emitter-collector transfer efficiency. Additionally, the doping level $n_e$ of the emitter has to be greater than the doping level $n_b$ of the base in order to have transistor action. This in turn means that the emitter capacitance $C_e$ will be increased which will adversely affect the high frequency response of the transistor.

In conventional transistors using homojunctions, it is impossible to have band edge discontinuities between the emitter, base, and collector regions. Thus, the emitter has to be more highly doped than the base in order that the injected charge carriers from the emitter to the base are greater in number than the reverse injected charge carriers from the base to the emitter. As will be appreciated later, the present improved semiconductor device uses heterojunctions having band edge discontinuities, the valence band edge discontinuity $\Delta E_v$ preventing reverse injection of carriers from the base to the emitter, while the conduction band edge discontinuity $\Delta E_c$ provides a tunneling barrier for charge carriers moving from the emitter to the collector. Thus, the present device does not have to have its emitter doping be larger than its base doping and in fact the reverse is true. This significantly improves the device characteristics on the emitter side so that base resistance can be kept low (by heavy doping) while emitter capacitance is also very low.

While attempts have been made to modify the geometry and doping of conventional semiconductor transistors to make them operate at higher frequencies, the prior art has also attempted to avoid the mechanism of diffusion as the primary charge transfer mechanism in such devices. Two examples of attempts to provide transistors which do not operate on the principle of diffusion of minority carriers through the base are illustrated in U.S. Pat. Nos. 3,225,272 and 3,358,158. In the former of these patents, two tunnel junctions are provided between heavily doped semiconductor materials with the spacing between the junctions sufficiently small that tunnel current from the emitter can proceed through the base region and across the collector junction. Thus, this is a triode having three heavily doped regions.

In this patent, good operability is questionable since the energy band diagrams show available energy states for electrons in the base region. If this is so, such electrons will stay in the base region and recombine therein with holes, rather than ever reaching the collector.

Notwithstanding the foregoing, U.S. Pat. No. 3,225,272 shows a device which suffers from a lack of integrity of the base-emitter junction and therefore has large inverse currents between the emitter and the base. Further, the emitter capacitance $C_e$ will be large since the space charge region on the heavily doped emitter side of the base-emitter junction is very small. There will be a high injection current in this device which will limit the probability of tunneling current and a high reverse injection will occur, resulting in small gain. On the collector side of that transistor, the integrity of the base-collector junction is doubtful due to the high doping of the base and collector regions. Also, there will be a large collector capacitance $C_c$ and extremely low breakdown voltages for the base-collector junction.

In U.S. Pat. No. 3,358,158, the collector is either degenerately or non-degenerately doped. If it is degenerately doped, the problems with respect to the tunneling transistor of the other patent occur. In the case of a non-degenerately doped collector, only a partial solution to the problem of low voltage breakdown of the base-collector junction will be obtained. However, this would create in the collector a relatively thick space charge region through which carriers must tunnel. The tunneling current might be either impeded completely or adversely increased when a collector voltage is applied. Thus, these prior art patents, which attempt to provide tunneling base transistors, still have many of the disadvantages inherent in conventional transistors using minority carrier diffusion across the base region.

In order to overcome the problems associated with prior art transistors and particularly those which attempt to utilize tunneling through the base region, applicants have provided a novel tunneling base transistor-like device which has many important advantages in addition to that of high speed operation. As will be more apparent later, the present device has both high input and output impedance, minimal leakage currents even though the base resistance is very low, very small emitter and collector capacitances, minimal electron-hole recombination, high transfer efficiency of charge carriers between the emitter and collector, and the absence of minority carrier storage effects in the base region. Thus, applicants have provided a tunneling base transistor-like device which can operate at extremely high speeds approaching those of a Josephson tunneling device, but which is easily operable at those speeds at room temperatures. Since the tunneling phenomenon is not itself temperature dependent, the only dependency on temperature will be the need to provide charge carriers of sufficient energy for tunneling across the base region in order to maintain the output current level of the device at low temperatures. This is easily achieved by increasing the emitter bias at very low temperatures of operation.

Accordingly, it is a primary object of the present invention to provide an improved high speed semiconductor device in which the dominant charge transfer mechanism is tunneling.

It is another object of this invention to provide a semiconductor tunneling base device having both high input impedance and high output impedance.

It is another object of the present invention to provide a device in which low leakage currents result even though the resistance of the base region is very small due to heavy base doping.

It is still another object of the present invention to provide a device which utilizes tunneling as the dominant charge transfer mechanism, but which minimizes electron-hole recombination in the base, emitter, and collector regions of the transistor.

It is a further object of the present invention to provide a novel transistor-like device in which there is negligible base current due to either recombination of charge carriers in the base and emitter or reverse injected current from the base to the emitter.

It is another object of the present invention to produce an improved tunneling base transistor-like device having a high transmission coefficient leading to high efficiency of charge transfer from the emitter to the collector.

It is yet another object of the present invention to provide an improved tunneling base semiconductor device in which there are no minority carrier storage effects in the base region.

It is another object of the present invention to provide an improved semiconductor tunneling base transistor-like structure which can be used as an amplifier, an oscillator, or as a switching element.

It is another object of the present invention to provide an extremely high speed, improved tunneling base device which can be fabricated by conventional techniques to produce individual devices or arrays of such devices having reproducibly uniform operating characteristics.

It is a still further object of the present invention to produce a tunneling base semiconductor device having very small emitter capacitance and collector capacitance.

BRIEF SUMMARY OF THE INVENTION

This improved semiconductor device broadly comprises three semiconductive regions, two of which have first conductivity type, while the third region (located between the two first conductivity regions) has opposite conductivity type. Thus, a transistor-like device having regions generally denoted as emitter, base, and collector can be provided. As in a conventional transistor, charge is transferred from the emitter to the collector. Depending upon the conductivity types of these regions, either an n-p-n or a p-n-p structure (or variations thereof) is provided. Both the base-emitter junction and the base-collector junction are heterojunctions. The materials comprising the emitter and collector regions can be the same or different, and in any event are different materials than the material comprising the intermediate base region. If desired, the emitter material can be chosen to provide a wide gap emitter, but such a choice is not absolutely necessary for the practice of this invention.

The heterojunction semiconductive device of the present invention is characterized in that the thickness of the base region is chosen to allow sufficient (thermionic) tunnel current between the emitter and the collector. Typically, the base will have a thickness of 100 Angstroms or less so that such tunneling can occur. In this semiconductor device, the dominant mechanism for charge transfer from the emitter to the collector is tunneling, rather than any other charge transfer mechanism. The thicknesses of the emitter and collector regions are not critical and can be, for instance, about 1,000 Å—fractions of a micron.

Another major characteristic of the present device is that the energy gaps of the emitter and collector regions are shifted in the same direction with respect to the energy gap of the base region, and overlap with the energy gap of the base region. Stated another way, both the valence band and the conduction band in the emitter and collector regions are shifted in the same direction with respect to the valence band and conduction band of the base region. This is particularly important since it provides a conduction band edge discontinuity $\Delta E_c$ establishing a potential barrier against charge transfer from the emitter to the base region. It is this potential barrier through which electrons must tunnel if they are to reach the collector. Still further, this type of band gap structure provides a valence band discontinuity $\Delta E_v$ which isolates the base region from both the emitter region and the collector region. This means that majority carriers in the base region are trapped in a potential well so that they cannot easily move to either the emitter or collector regions for recombination with the opposite type charge carriers. Both $\Delta E_c$ and $\Delta E_v$ are in the same direction in the energy diagram.

The tunneling base device of the present invention has its base region heavily doped which means that its base resistance is low. However, the problems associated with prior art devices are avoided since, in the present device, the base region is doped more heavily than the emitter region (and also more heavily than the collector region). As an example of suitable doping using p-type GaSbAs alloys for the emitter and collector regions and n-type InGaAs alloy for the base region, the base can be doped to a level of approximately $10^{19}$ cm$^{-3}$, while the emitter and collector can be doped to a level of approximately $10^{16}$–$10^{17}$ cm$^{-3}$.

Because tunneling is the dominant mechanism for charge transfer from the emitter to the collector, electron-hole recombination in the base region is minimal. Further, the base region is never depleted since its doping exceeds that of the emitter and collector regions. This means that the space charge region around the emitter-base junction is very wide and is located primarily on the emitter side of the junction. Consequently the emitter capacitance $C_e$ is very small. On the collector side of this device, the space charge region around the base-collector junction is primarily located on the collector side and is very large. This means that the collector capacitance $C_c$ is very low and the base-collector voltage $V_{bc}$ can be very high without breakdown, such as avalanche or tunneling breakdown, occurring across this junction.

Because the emitter and collector regions are doped less heavily than the base region and are not themselves heavily doped, the integrity of the emitter-base and base-collector junctions is better than in prior art tunneling base devices where high doping is used throughout. These lower doping ranges are also easier to provide during device fabrication. The properties of the various heterojunctions are readily adjustable by varying the composition of the materials used for the different semiconductor regions. As will be seen, semiconductor alloys are particularly suitable for the practice of this invention since the composition of these alloys can be readily changed to adjust the band edge discontinuities $\Delta E_c$, $\Delta E_v$ and lattice match between adjacent regions of the device.

As will be more apparent from the following description, the present heterojunction tunneling base device provides high input and output impedance and minimal leakage currents even though the resistance of the base region is very small due to its relatively heavy doping. Because tunneling is the dominant mechanism for charge transfer, there are no adverse minority carrier storage effects or transit time problems in the base region, and thus the high frequency operation of the device as either a switch or an amplifier is significantly improved over that of conventional transistors. Also, the transmission coefficient α for transfer of charge carriers between the emitter and collector regions is approximately 1.

In the further practice of this invention, devices having very uniform layers with very smooth, abrupt interface regions can be readily obtained. This means that substantially the same output characteristics will be obtained from a plurality of devices in an array of such devices, leading to good reproducibility. Further, the occurrence of interface states and the problems associated therewith are minimized by fabrication of layers with close lattice matching to provide very smooth and abrupt interfaces.

In the practice of this invention, epitaxy is generally used to provide the emitter, base, and collector regions, and in particular molecular beam epitaxy (MBE) appears to be the best process for fabrication of these devices. Molecular beam epitaxy will provide ultra-thin, well-defined multilayer heterostructures of high quality semiconductors in a controlled manner. As will be apparent, MBE in ultra-high vacuum is a very good technique for providing atomically smooth surfaces and extremely sharp boundaries at the interface of two closely lattice-matched alloy semiconductors with a minimum number of defects.

These and other objects, features, and advantages will be more apparent from the following more particular description of the preferred embodiments.

BRIEF DESCRIPTION OF THE DRAWINGS

FIG. 2A is a schematic representation of an n-p-n device in accordance with the present invention, while

FIG. 3A is a schematic representation of a p-n-p device in accordance with the present invention, while

FIG. 5A is a schematic top view of a planar tunneling base device in accordance with the present invention while

FIG. 8 is a schematic representation of a device in accordance with this invention, having a grounded emitter.

FIGS. 9 and 10 show a set of grounded emitter characteristics of the device illustrated in FIG. 8. FIG. 9 is the characteristic plotting emitter current $I_e$ versus base-emitter voltage $V_{be}$, while FIG. 10 is an output characteristic plotting collector current $I_c$ ($I_c = I_e$) versus collector-emitter voltage $V_{ce}$, for three values of $V_{be}$.

DETAILED DESCRIPTION OF THE PREFERRED EMBODIMENTS

This semiconductor is a heterojunction structure having a very thin base region across which charge carriers tunnel to provide the dominant mechanism for charge transfer between the emitter and the collector. The output characteristics of this device are those of a transistor having very high output impedance. The base current in this device is approximately zero, in contrast with an ordinary transistor where the base current includes a component due to inverse injection of carriers from the base into the emitter, and hole-electron recombination in the base region. Thus, the present device also has high input impedance. The output characteristics of this device are similar to those of a field effect transistor, since the output curves of collector current versus collector voltage depend on the emitter-base voltage, rather than on emitter current $I_e$.

THEORY AND ADVANTAGES (FIGS. 1A–1D, 2A, 2B, 3A, 3B)

These figures show energy band diagrams for a semiconductor device in accordance with the present invention. This is a heterojunction device in which carriers can move from the emitter to the collector by tunneling through a very thin base region. Further, charge carriers in the base region are held there by a potential well so that leakage currents to the emitter and to the collector are extremely small.

Figure 1A:
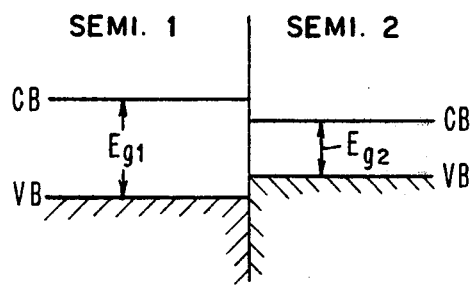
FIGS. 1A and 1B illustrate two types of heterojunction energy band diagrams, where the energy diagram of FIG. 1A (which is more conventional) is unsuitable for the practice of this invention, while the energy diagram of FIG. 1B is suitable for the practice of this invention.

At the interface between two different semiconductors, the potential energy can exhibit a sharp edge, or discontinuity. Heterostructures consisting of at least two semiconductors contain such a potential change. FIG. 1A shows one type of potential discontinuity which is usually found in heterostructures. Here, the energy gap $E_{g1}$ of semiconductor 1 is aligned with the energy gap $E_{g2}$ of semiconductor 2. That is, the conduction band CB and valence band VB of semiconductor 2 are located within the energy gap of semiconductor 1.

As will be more fully apparent later, the energy band diagram of FIG. 1A is not suitable for the practice of the present invention. However, the energy band diagram of FIG. 1B is suitable and is required for the tunneling base device of the present application.

Figure 1B:
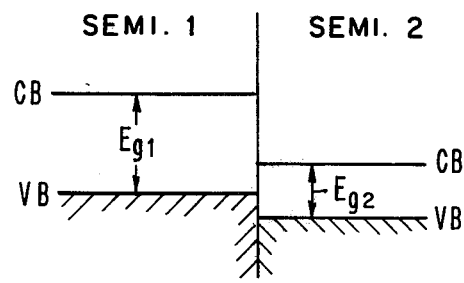

In more detail, FIG. 1B shows an energy band diagram in which the energy gap $E_{g1}$ is crossed (overlapped) with the energy gap $E_{g2}$ of semiconductor 2. The conduction band and valence band of semiconductor 2 are shifted in the same direction with respect to the conduction band and valence band, respectively, of semiconductor 1, but the conduction band CB of semiconductor 2 is within the energy gap of semiconductor 1. Devices in accordance with the present invention use semiconductors where either the CB edge or VB edge (but not both) of one semiconductor lies in the energy band gap of the adjacent semiconductor. Heterostructures having overlapping energy bands and band edge discontinuities of the type shown in FIG. 1B are described on p. 11 of a book by Milnes and Feucht entitled "Heterojunctions and Metal-Semiconductor Junctions".

Figure 1C:
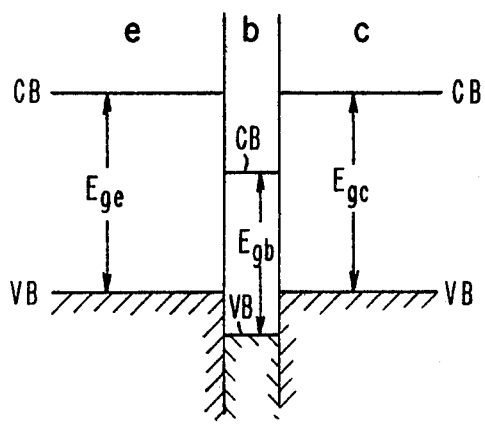
FIGS. 1C and 1D illustrate two relationships of the energy bands of the emitter and collector with respect to the energy band of the base for the subject semiconductor device. This device requires that the energy band shift of the emitter and of the collector be in the same direction with respect to the energy band of the base and overlap with the energy band of the base.
Figure 1D:
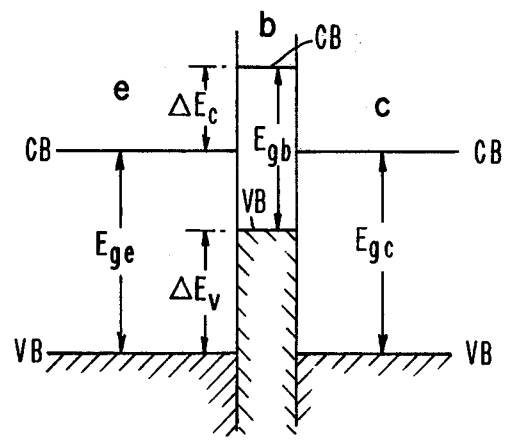

FIGS. 1C and 1D show the energy band diagrams of complete transistor-like structures suitable for the practice of this invention. These structures are comprised of three regions denoted emitter e, base b, and collector c. The potential discontinuities between these different regions are illustrated in FIGS. 1C and 1D. The nomenclature is the same as that used for FIGS. 1A and 1B. Consequently, the conduction bands CB and valence bands VB are denoted for each of the semiconductive regions. The band gaps for the emitter, base, and collector regions are denoted $E_{ge}$, $E_{gb}$, and $E_{gc}$, respectively.

As will be noted from these FIGS., the energy band shifts of the emitter and collector regions are in the same direction with respect to the energy band of the base. In FIG. 1C, the energy bands of the emitter and collector are shifted upward with respect to the energy band $E_{gb}$ of the base, while in FIG. 1D, the energy bands of the emitter and collector are shifted downward with respect to that of the base. In both figures, there is overlapping of the energy bands of the emitter and collector with respect to the energy band of the base in the manner described previously. The amount of overlap will depend on the materials used for the emitter, base, and collector.

These energy diagrams illustrate two important features of the present device. Referring to FIG. 1D, electrons in the conduction band of the emitter have to surmount the energy barrier due to conduction band discontinuity $\Delta E_c$ in order to get to the collector. However, the base region is sufficiently thin (about 100 Å or less) that there exists a finite probability that sufficient thermionic tunnel current will exist between the emitter and the collector. The energy barrier $\Delta E_c$ is sufficiently high that thermal energies (at operating temperatures, such as room temperature) will not bring charge carriers (electrons) in the conduction band of the emitter to energies greater than the bottom of the conduction band in the base region. Thus, the dominant mechanism for charge carrier movement from the emitter to the collector will be by tunneling through the base region.

The band diagram shown in FIG. 1D (and that in FIG. 1C) insures that majority carriers in the base region will not be inverse injected into either the emitter or the collector. For example, in FIG. 1D the potential step of height $\Delta E_v$ will prevent holes in the base region from moving across the emitter-base junction to the emitter. Another potential step of this height also prevents holes in the base from going to the collector. Thus, the base is essentially isolated from the emitter and the collector so that leakage currents from the base to both the emitter and the collector are minimal.

Due to $\Delta E_c$ and $\Delta E_v$, tunneling current $J_T$ is clearly dominant and the probability of injected hole current $J_h$ and injected electron current $J_e$ is very small. For example, at room temperatures the ratios of these currents $J_h/J_e/J_T$ could be about $1/1/10^4$ with the proper choice of material parameters.

Since tunneling is the dominant mechanism for charge transfer from the emitter to the collector, adverse effects due to minority carrier storage and transit in the base region are largely avoided. Thus, whether the present device is used as a switch or as an amplifier, charge carriers instantaneously pass through the base region and therefore the high frequency operation of the present device is excellent.

The transmission coefficient $\alpha$ representing charge transfer from the emitter to the collector is approximately unity in the present transistor. Since charge carriers tunnel through the base region instantaneously, hole-electron recombination in the base is largely minimized. Further, the base current is approximately zero in this device, since there is minimal recombination of holes and electrons in the base region and since there is very little inverse injection of base majority carriers into the emitter.

Performance of the present device is substantially independent of operating temperature, in contrast with ordinary transistors which operate on the principle of diffusion of carriers across the base. However, at lower temperatures, a somewhat higher emitter bias may be required in order to have charge carriers in the emitter be at a sufficiently high energy level for tunneling through the base region. At these lower temperatures, tunneling will be even more dominant as the preferred charge transfer mechanism.

This improved device has both high input impedance and high output impedance. The base region acts essentially as an isolator between the emitter and the collector and the large potential well restricting movement of charge carriers in the base region means that very low leakage currents will occur from the base to the emitter and the collector. Since there is very little hole-electron recombination in the base region, and since the injection of carriers from the base to the emitter is very small, the input characteristics of the present device indicate a very high input impedance. Thus, while ordinary transistors usually provide high output impedance, the present device provides both high input impedance and high output impedance.

Figure 2A:
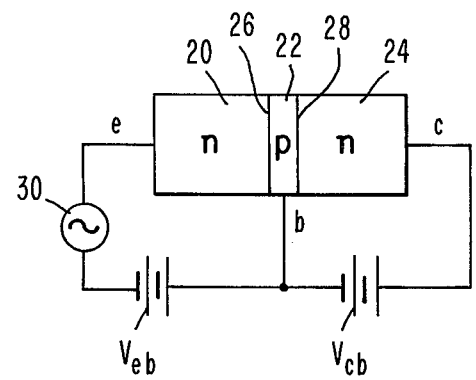
Figure 2B:
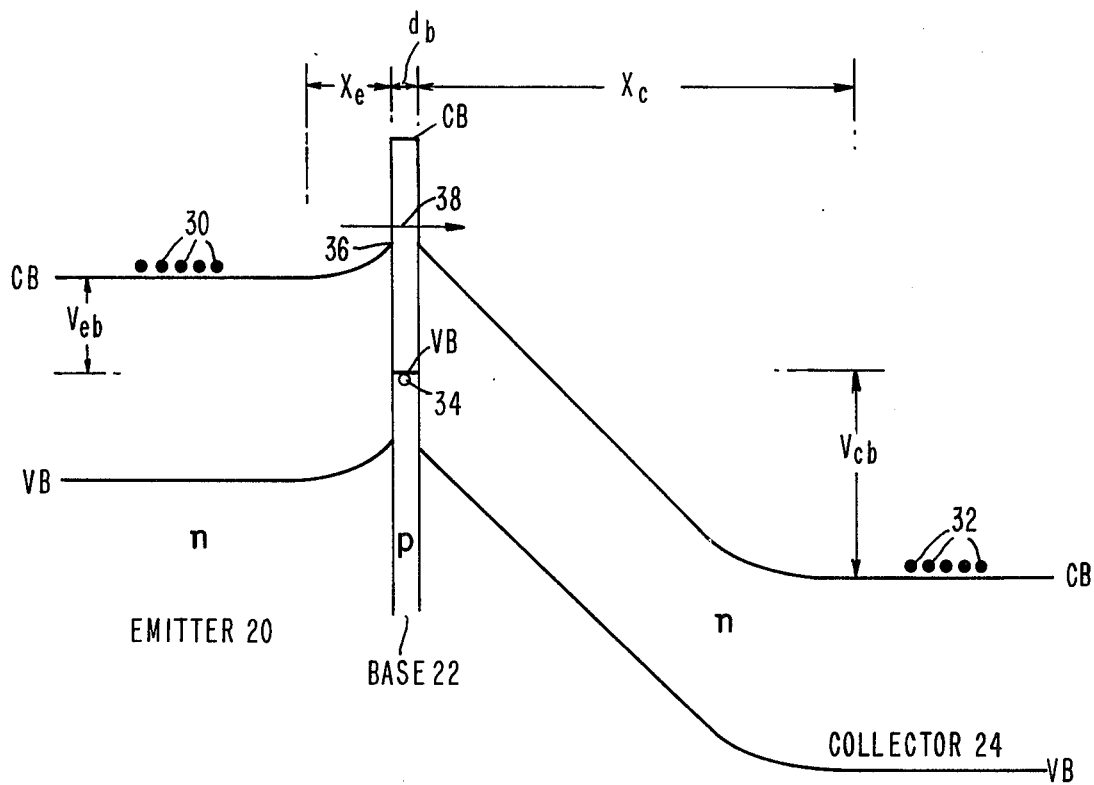
FIG. 2B is an energy band diagram of the device of FIG. 2A, in the biased condition.

FIGS. 2A and 2B

FIG. 2A illustrates a conventional n-p-n structure for an improved tunneling base device in accordance with the present invention, while FIG. 2B shows the energy band diagram for the device of FIG. 2A.

The device is comprised of an n-type emitter region 20, a p-type base region 22, and an n-type collector region 24. Voltage $V_{eb}$ forward biases the emitter-base junction 26, while voltage $V_{cb}$ reverse biases the base-collector junction 28. A signal source 30 is used to modulate the emitter-base voltage, as is well known in the art.

FIG. 2B shows the energy band diagram for the device of FIG. 2A, when the device is in a biased condition. The conduction and valence bands of both the emitter and the collector are shifted downward with respect to the conduction and valence bands of the base region. The emitter-base junction 26 is forward biased by the voltage $V_{eb}$, while the base-collector junction 28 is reverse biased by the voltage $V_{cb}$. Electrons in the conduction band of the emitter 20 are indicated by the dark circles 30, while electrons filling energy levels in the conduction band of the collector are indicated by the dark circles 32. Holes in the base region 22 are indicated by the open circles 34.

In the operation of the n-p-n structure of FIG. 2A, electrons 30 in the conduction band of the emitter will tunnel through the base region if they have an energy at least as great as that at level 36. This tunneling is indicated by the arrow 38. Electrons in the emitter cannot easily rise to energy levels above the bottom of the conduction band of the base and must get to the collector by tunneling, if at all. Electrons which tunnel through the base region are collected with the help of the collector field and are collected through the high reverse impedance of the base-collector junction. The tops of the valence bands in the emitter and collector regions are sufficiently below the top of the valence band in the base region. This potential well ($\Delta E_v$) for holes 34 in the base prevents them from going into the emitter or collector regions for recombination with electrons.

At lower temperatures, less electrons will be at the energy level 36 than are at that level at room temperatures. Consequently, the bias $V_{eb}$ would be increased slightly at low temperature operation to insure that the current levels are maintained, if desired.

The space charge region about the emitter-base junction is primarily located on the emitter side of this junction. Thus, the bending of the conduction band in the emitter region from a level 36 to its flattened level occurs over a distance $x_e$. Since this is a long distance, the emitter capacitance $C_e$ (which is proportional to $1/x_e$) is very small. This provides improved operation of the present device with respect to ordinary transistors and with respect to prior art transistors which have attempted to use tunneling as the dominant mechanism for charge transfer between the emitter and the collector since, in those prior art devices, the distance $x_e$ is very small due to high emitter doping.

In a similar manner, the space charge region on the collector side of the base-collector junction is very long, having a length $x_c$. Consequently, the collector capacitance $C_c$ (which is proportional to $1/x_c$) is also very small.

The effective width $d_b$ of the base region is approximately the physical width of the base itself since the space charge region within the base is very small. The physical width of the base is generally not in excess of 100 Angstroms, so that sufficient tunneling through the base region can occur. In practice, the thicknesses of the emitter and collector regions are not critical, and thicknesses of approximately 1000 Angstroms - fractions of a micron are suitable for these regions.

In accordance with known principles, the emitter and collector are not made so thin that it is difficult to make electrical contact to them, and must be at least thicker than the depletion width in them. However, if they are made too thick, the overall transit time for carriers moving from the emitter to the collector electrode will be excessive. Thus, the stated range of thicknesses is generally used.

In the present invention, the doping level of the collector is significantly less than that of the base. In contrast with this, the aforementioned prior art tunneling base transistors use high doping levels in both the base and collector regions. Accordingly, the present improved transistor-like device has lower capacitance $C_c$, is less likely to have charge flow from the base to the collector region, and is more resistive to breakdown (such as avalanche or tunneling breakdown) across the reverse biased base-collector junction.

Figure 3A:
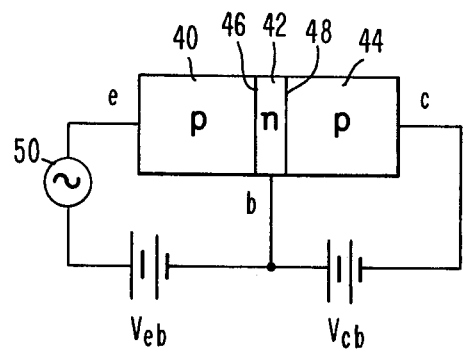
Figure 3B:
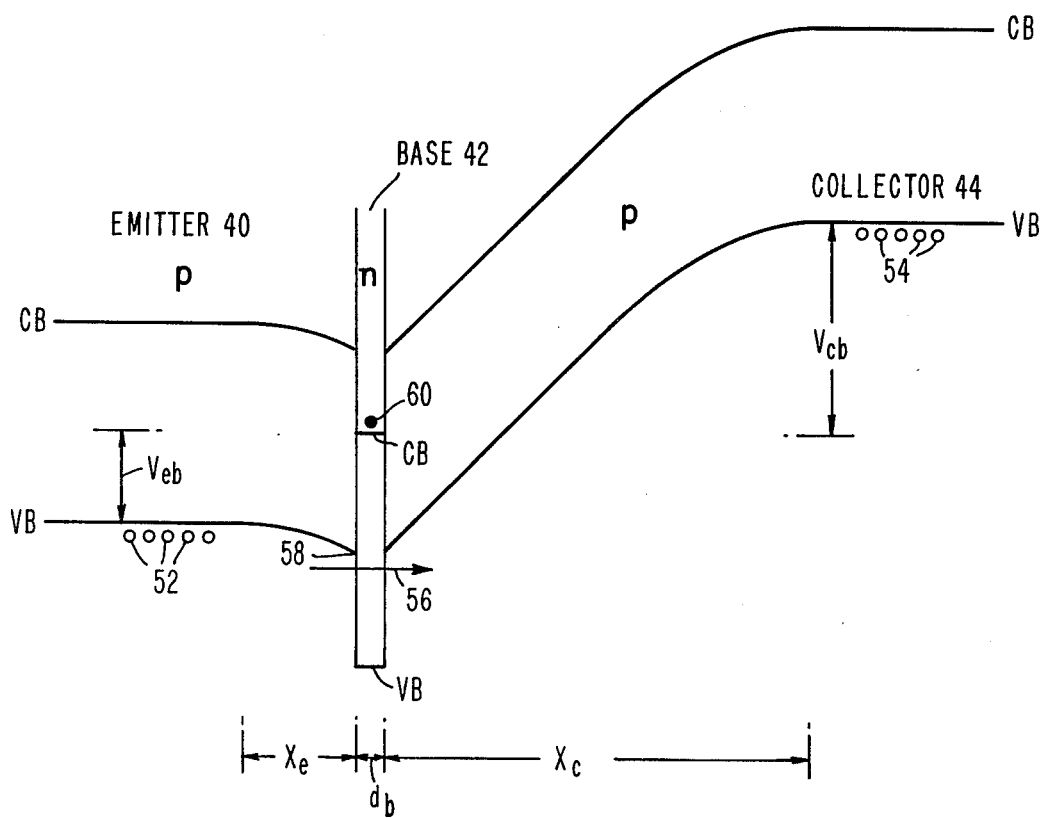
FIG. 3B is an energy band diagram of the device of FIG. 3A, in a biased condition.

FIGS. 3A and 3B

FIG. 3A shows a typical p-n-p device having appropriate biasing, while FIG. 3B is an energy band diagram for the device of FIG. 3A, in a biased condition.

In more detail, the device of FIG. 3A comprises a p-type emitter region 40, an n-type base region 42, and a p-type collector region 44. The emitter-base junction 46 is biased in the forward direction by a voltage source $V_{eb}$, while the base-collector junction 48 is biased in the reverse direction by voltage source $V_{cb}$. A signal source 50 is used to provide signal voltages to the device, to modulate the voltage across the emitter-base junction.

In the energy band diagram of FIG. 3B, the energy bands of the emitter and collector are shifted upward with respect to the energy band of the base region. Holes in the top of the valence band of the emitter 40 are denoted by the open circles 52, while holes in the top of the valence band of the collector 44 are denoted by the open circles 54. The emitter-base junction 46 is forward biased by the voltage $V_{eb}$, while the base-collector junction 48 is reverse biased by the voltage $V_{cb}$.

The p-n-p structure of FIG. 3A also exhibits very low emitter capacitance $C_e$ and collector capacitance $C_c$, for the same reasons that the device of FIG. 2A has low $C_e$ and $C_c$. That is, the space charge region on the emitter side of junction 46 has a very long length $x_e$ and the space charge region on the collector side of junction 48 has a long length $x_c$. There is very little space charge in the base region and its effective width $d_b$ is essentially its physical width.

In operation, a voltage signal applied by source 50 to the forward biased base-emitter junction 46 will cause holes 52 in the emitter region to tunnel through base region 42 for collection at the collector 44. This tunneling, which is indicated by arrow 56, will occur when holes 52 reach an energy level 58. Due to the potential well for electrons (represented by darkened circles 60) in the base region, these electrons cannot easily move to either the emitter or collector regions. For low temperature operation, $V_{eb}$ can be increased slightly to maintain high levels of collector current, if that is necessary.

In the practice of the present invention, the base region is more heavily doped than either the emitter or the collector regions, and generally is much more heavily doped than these regions. The base region is doped more heavily to insure that it is not depleted of charge carriers during operation. This insures that the emitter-collector current transfer can be controlled by the signals applied to the base.

Since the base is more heavily doped than the emitter or the collector, the space charge region about the base-emitter junction will be located primarily on the emitter side of the junction. For a corresponding reason, the space charge region around the base-collector junction will be primarily located on the collector side.

Heavy doping of the base region also means that the resistance of this region is small. Since the doping level of the emitter and the collector is not high, the integrity of the base-emitter junction and the base-collector junction is high, in contrast with prior art transistors. This is especially so since prior art transistors require that the doping level of the emitter be greater than that of the base in order to have transistor action.

In summary, the fact that the base is more highly doped than the emitter and collector provides several advantages. On the emitter side, the base is never depleted and the distance $x_e$ is very wide which provides low input capacitance $C_e$. On the collector side, there is again no depletion in the base region and the quantity $x_c$ is large. This means that holes cannot easily tunnel from the base to the collector, that the collector capacitance $C_c$ is very low, and also that the collector voltage can be very high without breakdown across the base-collector junction.

In the present device, the band edge discontinuities $\Delta E_c$, $\Delta E_v$ of the same sign arising from the use of heterojunctions, together with the thinness of the base region and the doping inequalities described provide the advantages which have been listed.

EXAMPLES (FIG. 4)

Figure 4:
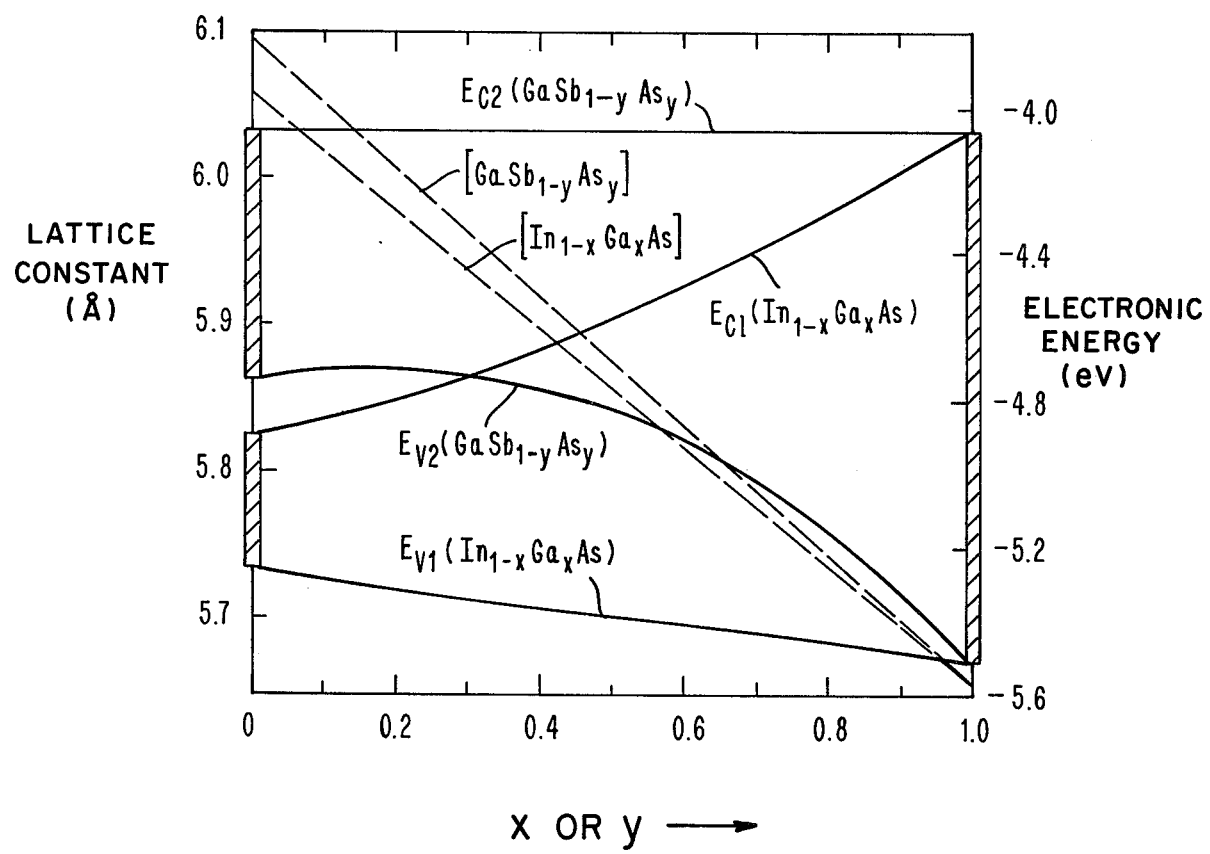
FIG. 4 is a plot of lattice constant and electronic energy versus composition for two alloys which can be used to make the present semiconductor tunneling base device. From this, a designer can choose alloy compositions, having suitable lattice matches and energy band differences.

In the fabrication of devices operating in accordance with the principles of this invention, semiconductor alloy systems typically provide suitable materials. For example, a p-type emitter and p-type collector can be a semiconductor alloy of the system $GaSb_{1-y}As_y$, while an n-type base region can be a semiconductor alloy of the system $In_{1-x}Ga_xAs$. FIG. 4 illustrates the lattice constant and electronic energy of these two alloy systems.

In more detail, the lattice constant of both $GaSb_{1-y}As_y$ and $In_{1-x}Ga_xAs$ is plotted against x and y as is the electronic energy of these two alloys. The conduction band energy for the $In_{1-x}Ga_xAs$ system is denoted $E_{c1}$, while the valence band energy for this system is denoted $E_{v1}$. For the $GaSb_{1-y}As_y$ system, the conduction band energy is denoted $E_{c2}$ while the valence band energy is denoted $E_{v2}$. Thus, for any x or y, the vertical distance between the $E_{c1}$ curve and the $E_{v1}$ curve will give the energy bandgap for the $In_{1-x}Ga_xAs$ system, while the distance between the $E_{c2}$ curve and the $E_{v2}$ curve will give the energy bandgap for the $GaSb_{1-y}As_y$ system. The ordinate energy scale refers to the vacuum level.

FIG. 4 can be used for the design of heterojunction devices suitable for use in accordance with the principles of the present invention. For example, one could choose a particular value of x to give the alloy $In_{1-x}Ga_xAs$. At that value of x, the energy bandgap in the base region of a p-n-p device can then be determined from the curves $E_{c1}$ and $E_{v1}$ and the lattice constant of $In_{1-x}Ga_xAs$ could also be read from FIG. 4. For the same lattice constant the designer could move horizontally across this plot to the lattice constant curve for $GaSb_{1-y}As_y$ and read vertically downward to obtain the compositional parameter y.

As will be described in the section on fabrication, devices in accordance with the present invention often are comprised of epitaxial semiconductor layers which form heterojunctions. In the alloy systems of FIG. 4, a suitable device can be made by choosing $x=y=0.5-0.6$. Then the lattice mismatch would be approximately zero. For $x=y=0.5$, $\Delta E_c \simeq \Delta E_v = 0.5$ eV. If $x=y=0.6$, $\Delta E_c \simeq \Delta E_v = 0.4$ eV. The physical thickness of the base layer is not in excess of about 100 Å. Consequently, when hole charge carriers in the emitter are at an energy level 58 (FIG. 3B), they will have a high probability of tunneling across the base layer, for room temperature operation. Doping levels are as set forth previously.

These heterojunction structures can be prepared by molecular beam epitaxy (MBE). The choice of ternary alloys allows one to vary the overlap configuration of the energy gaps and, simultaneously, to maintain close lattice matching through the control of the alloy compositions. This enables one to prepare junctions which have smooth and abrupt interfaces without compositional grading and which are free of defects.

Sn is a donor in InGaAs alloys, and can be either a donor or acceptor in $GaSb_{1-y}As_y$ alloys, depending on the ratio of Sb/As. If $y \gtrsim 0.2$, Sn will be a doner, while if $y \lesssim 0.1$, Sn is an acceptor. Between $y=0.1$ and $y=0.2$, competing processes result in what is known as compensation. Zn and Mg are likely acceptors in GaSbAs alloys. Thin films of these alloys can be grown by MBE on (100) surfaces of GaSb, InAs, and GaAs maintained between 450° and 600° C.

Other alloy systems which could be used to make the present tunneling base device include Si-GaP, and alloy systems which will give overlapping band structures of the type shown in FIG. 1B. For example, III-V, II-VI, and IV-VI semiconductors, or combinations of these, can be used to make suitable heterojunction devices. While few ternary alloys will provide the proper band gap configuration, quaternary systems, etc., can be designed for this purpose in accordance with the requirements set forth herein—i.e., heterojunctions with proper band gap shifts, band edge discontinuities $\Delta E_c$, $\Delta E_v$, sufficiently thin base, base carriers (doping) greater than emitter and collector carriers, and good, abrupt interfaces.

FABRICATION

In order to obtain devices having optimum input and output characteristics, this heterojunction tunneling base device should have good interfaces between the emitter and base regions and between the base and collector regions. Molecular beam epitaxy (MBE) is a particularly suitable way for obtaining layered devices with good interfaces. Also, ternary alloys as mentioned previously are very suitable materials in the practice of this invention since the alloy composition can be controlled to vary the overlap configuration of the energy bands and also to maintain close lattice matching. In this regard, close lattice matching is important since stresses between dissimilar materials can lead to generation of dislocations and other faults and can possibly produce interface states. As is known, the presence of such interface states will reduce the total current passing from the emitter to the collector, since charge carriers may enter interface states around the base-emitter junction. Generally, if the lattice mismatch is not in excess of about 2.5%, good devices will be produced. Further, minimal lattice mismatch will allow epitaxial layers to be grown which are metallurgically smooth and well defined. This provides a well defined tunneling barrier for charge carriers moving from the emitter to the collector.

Molecular beam epitaxy is a process which is known in the art for providing sharp heterojunctions. References describing the use of such a technique to provide semiconductor structures having sharply defined junctions include the following.

1. L. L. Chang et al, "The Growth of GaAs-GaAlAs Super-lattice", J. Vac. Sci. Technol., Volume 10, No. 1, January/February 1973, p. 11.
2. L. L. Chang et al, "Structures Grown by Molecular Beam Epitaxy", J. Vac. Sci. Technol., Volume 10, No. 5, September/October 1973, p. 655.
3. L. Esaki et al "Semiconductor Superfine Structures by Computer-Controlled Molecular Beam Epitaxy", Thin Solid Films, 36 (1976), pp. 285-298.
4. G. A. Sai-Halasz et al, Applied Physics Letters, 30, June 15, 1977, p. 651.
5. U.S. Pat. No. 3,626,257

MBE is an evporation process where the vapor density is constant in time. Since it is a low temperature process, diffusion between different constituent layers is minimized which prevents graded compositions at the boundaries between two different compositions. Thus, junctions can be created having very abrupt energy band discontinuities. Also, this is a physical process so that sharp barriers can be created, in contrast with other semiconductor layering techniques, such as liquid phase epitaxy where materials are in contact with molten solutions of constituents.

The MBE system used to produce $In_{1-x}Ga_xAs$-$GaSb_{1-y}As_y$ devices is similar to that described in reference 2 with the exception of four effusion cells containing elemental In, Ga, Sb, and As, and additional cells containing desirable dopant elements. Films of $In_{1-x}Ga_xAs$ and $GaSb_{1-y}As_y$ can be grown at rates of approximately 1-3 Angstroms per second on (100) surfaces of GaSb, InAs, and GaAs which are maintained between 450° and 600° C.

For the growth of heterojunctions, a typical sequence is as follows: Starting with a p-type GaSb substrate having a doping level of approximately $10^{17}$ cm$^{-3}$, a homoepitaxial film of approximately 1000 Angstroms is deposited for smoothing out the surface of the GaSb substrate. Subsequently, a collector region of p-type $GaSb_{1-y}As_y$ is deposited which has an impurity level of about $5 \times 10^{16}$ cm$^{-3}$. The base region is also formed by MBE and is n-type $In_{1-x}Ga_xAs$ with a doping level of $10^{18}$–$10^{19}$ cm$^{-3}$. After this, another layer of $GaSb_{1-y}As_y$ is epitaxially deposited to form the emitter. The finished surface is extremely smooth. Ohmic contacts can be made by alloying Au-Ge to $In_{1-x}Ga_xAs$, and Au-Sn to $GaSb_{1-y}As_y$.

MBE is a good technique for making an array of these tunneling base devices. It is important that the thickness of the base regions of all devices in the array be uniform so that the same tunneling probability will exist for each such device. Also, the presence of smooth layers means that part of the tunneling region won't burn out due to excess currents. Still further, the presence of abrupt interfaces and lattice matching between the different regions of each device minimizes interface states so that recombination between holes and electrons is minimized. By varying the alloy compositions (x and y) barrier heights between the emitter and the base and between the base and the collector can be adjusted. In this regard, the potential well for retaining majority carriers in the base can be different than the potential barrier for tunneling (i.e., $\Delta E_c$ and $\Delta E_v$ can have different magnitudes). Again, adjustment of alloying composition achieves this. In particular, for the semiconductor alloying system shown in FIG. 4, one of skill in the art can easily choose compositions to give the desired band edge discontinuities.

FIGS. 5A, 5B, 6A–6E, and FIGS. 7A–7F

Figure 5A:
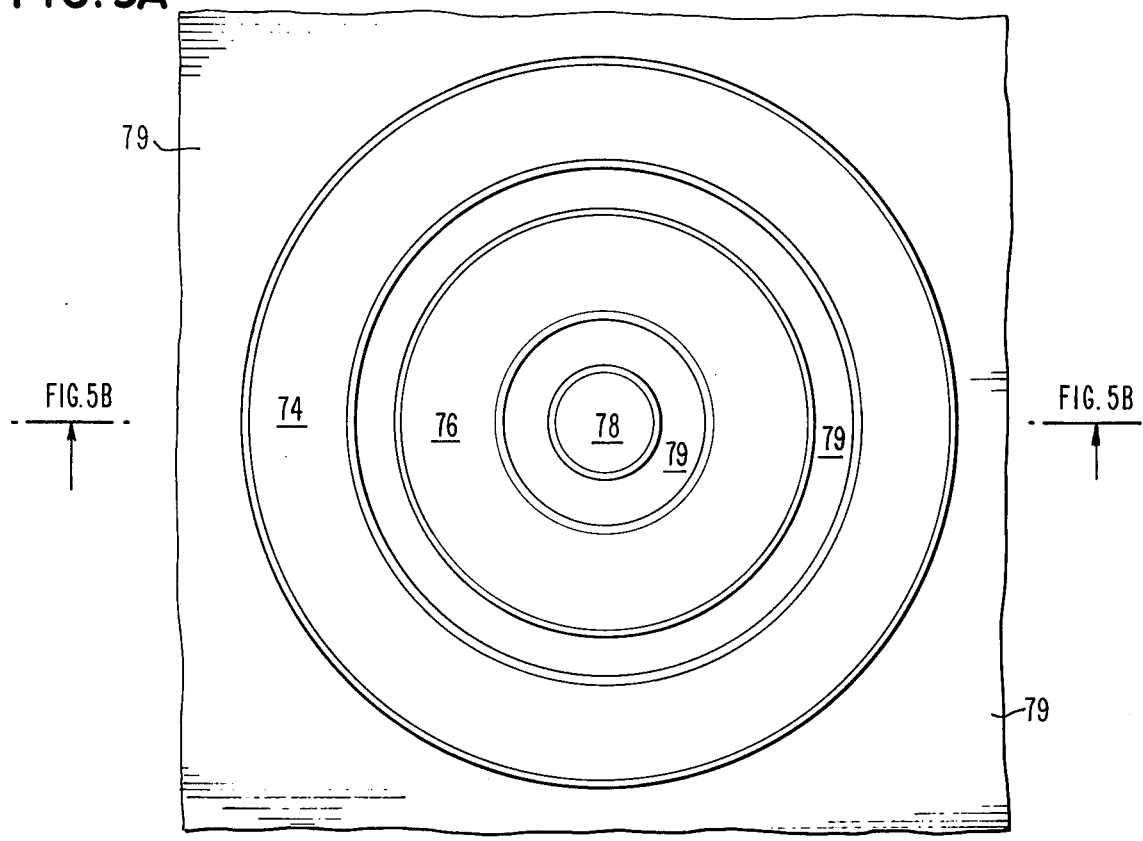
Figure 5B:
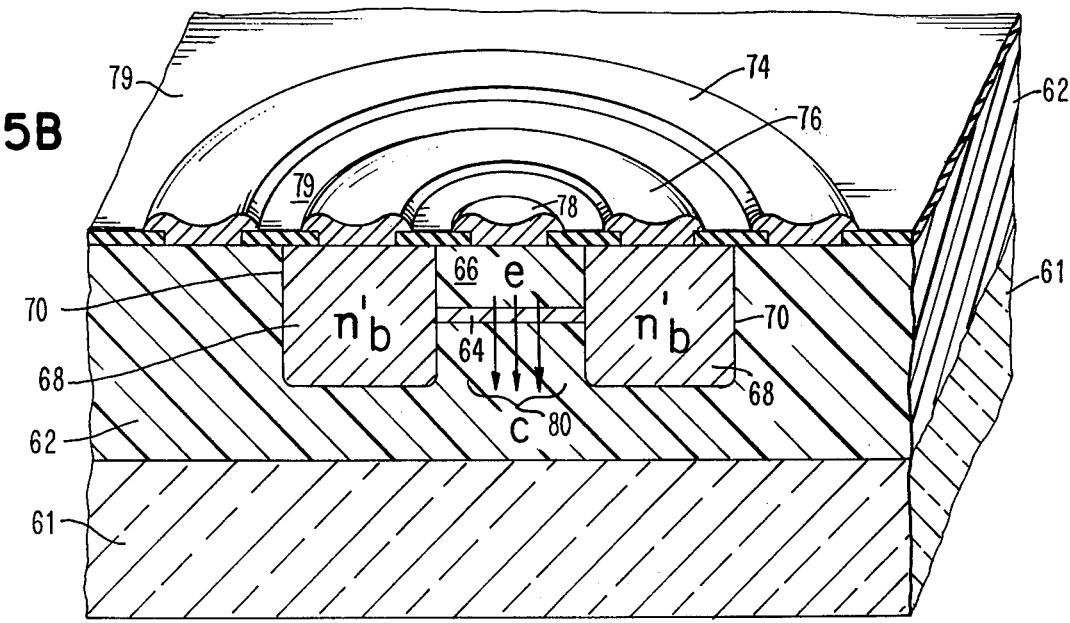
FIG. 5B is a cross-sectional view of this planar device.

FIGS. 5A and 5B show a representative p-n-p transistor-like structure in accordance with the present invention, which is fabricated as a monolithic structure on a substrate 61. FIG. 5B is a cross-sectional view showing the collector region 62, base region 64, and emitter region 66. Regions 68 are used to provide electrical contact to the base region 64 which is located between the emitter and collector regions. Regions 68 having a doping $n_b'$ which is less than the doping $n_b{}^+$ of the base region. Isolation between the base and the collector is provided since the p-n junctions 70 between regions 68 and the collector 62 are reverse biased. A suitable doping for regions 68 is $n_b' \simeq 10^{17}$ cm$^{-3}$. In order to minimize current flow between the emitter 66 and regions 68, $n_b'$ should be as low as possible. This will insure that sufficient current will tunnel across base 64. However, if $n_b'$ is too small, the base resistance $r_b$ will increase. Of course, regions 68 could be highly conducting (such as metallic regions) if they could be electrically insulated from the emitter and collector regions.

Ring conductor 74 is used to provide ohmic contact to collector 62, while ring conductor 76 provides ohmic contact to the base contact region 68. Conductor 78 provides ohmic contact to the emitter 66. Electrical insulation between each of the conductors is provided by insulation material 79, which could be $SiO_2$. Arrows 80 indicate the tunneling carriers which move from the emitter to the collector.

The structure of FIGS. 5A and 5B is generally known in the semiconductor art, comprising a monolithic layered device. The different layers comprising the collector, base, and emitter are preferably lattice matched and deposited using MBE, which provides exceptionally fine interfaces between the different layers. As an example, emitter 66 and collector 62 can be p-type $GaSb_{1-y}As_y$, while base 64 is $n^{30}$-type $In_{1-x}Ga_xAs$. Base connection regions 68 are n-type $In_{1-x}Ga_xAs$, and the substrate 61 is semi-insulating GaAs.

Figure 6A:
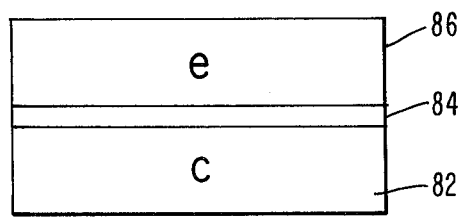
FIGS. 6A-6E illustrate one fabrication process suitable for making a single tunneling base device in accordance with the present invention.

FIGS. 6A–6E show side views illustrating one technique for making a single tunneling base device. The individual fabrication steps are well known in the semiconductor art, and include steps such as chemical etching and regrowth. In FIG. 6A, a collector region 82 is deposited on a substrate, not shown, using MBE. The thickness of this layer is approximately 1000 Angstroms. After this, a base layer 84 is deposited by MBE. Finally, the emitter layer 86 is deposited, also using MBE. This provides a heterojunction layered structure in which the interfaces between the various layers are very sharp and well defined and in which compositional grading at the interfaces is minimal. The base layer is doped during deposition to provide its high impurity concentration.

Figure 6B:
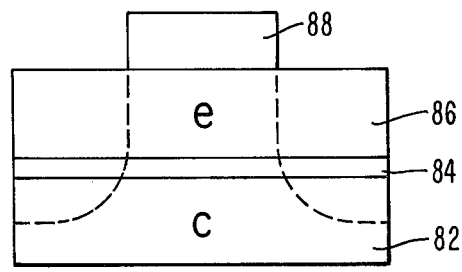
Figure 6C:
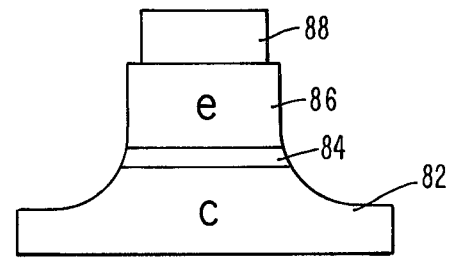
Figure 6D:
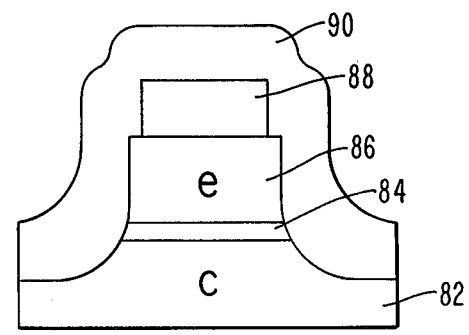
Figure 6E:
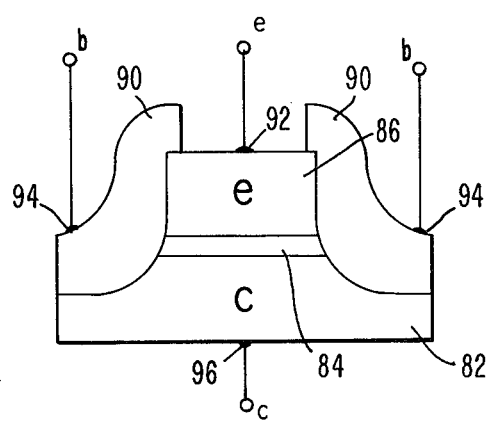

In FIG. 6B, a mask 88 is used to protect portions of the structure which are to be untouched during an etching step. Mask 88 can be a mechanical mask, or one comprising $SiO_2$ patterned using conventionally known resist techniques. During a chemical etching step, portions of layers 82, 84 and 86 are removed, generally following the profile indicated by the dashed lines. This leaves the structure shown in FIG. 6C.

After this, a semiconductive material 90 is deposited having the doping level $n_b'$. Material 90 is used for the base contacts. The doping of layer 90 is less than that of the base region 84, and is preferably less than that of either the emitter or the collector. This insures that tunneling breakdown will not occur across the junctions between regions 68 (FIG. 5B) and the collector and emitter.

Layer 90 is then masked and removed from the top surface of emitter layer 86 so that electrical contact can be made to the emitter. After this, ohmic contacts are alloyed to the emitter, base, and collector. Specifically, contact 92 is provided to the emitter, while contact 94 is provided to the regions 90 for electrical contact to the base region 84. Ohmic contact 96 is made to the collector.

While fabrication of a single device is illustrated by FIGS. 6A–6E, the fabrication of a plurality of these devices in a single surface of a wafer would be in accordance with known semiconductor fabrication techniques.

FIGS. 7A–7F illustrate another technique for providing a single tunneling base device in accordance with the present invention using conventional process steps. In this technique, a collector layer 100 is provided on a suitable substrate (not shown) by MBE, followed by MBE deposit of a base region 102.

Figure 7A:
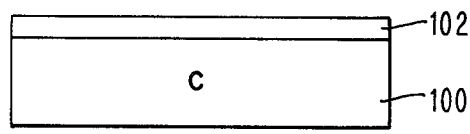
FIGS. 7A-7F illustrate another set of fabrication steps which can be used to produce a single tunneling base device in accordance with the present invention.
Figure 7B:
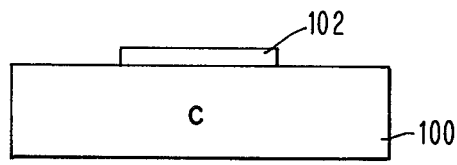
Figure 7C:
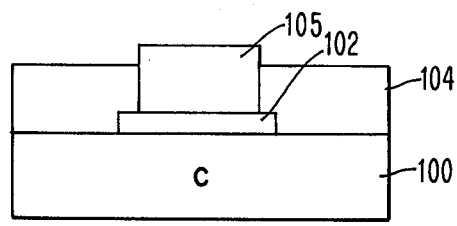
Figure 7D:
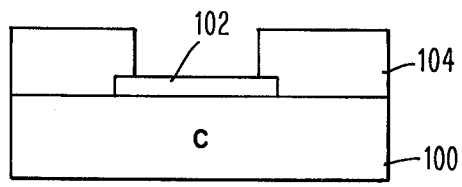
Figure 7E:
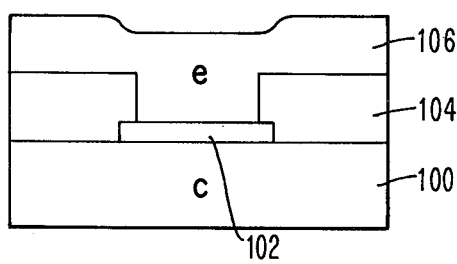
Figure 7F:
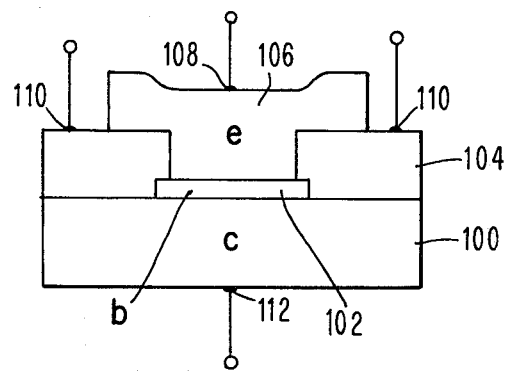

In FIG. 7B, the base region is partially etched away leaving only a thin layer in the center of the device. After this, a layer 104 of material having doping $n_b'$ is deposited using a mask 105. When mask 105 is removed, the structure of FIG. 7C is left. Then, a layer 106 of material to be used as the emitter is deposited by MBE. This completely coats the top surface of layers 102 and 104. After this, layer 106 is masked and portions thereof are removed to expose portions of the top surface of layer 104. Ohmic contacts are then made to the emitter, base, and collector. In more detail, conductor 108 makes ohmic contact to the emitter region, conductors 110 make ohmic contact to layer 104 having doping $n_b'$, and conductor 112 makes ohmic contact to the collector region.

OUTPUT CHARACTERISTICS (FIGS. 8–10)

FIG. 8 shows a p-n-p structure having an emitter region 114, base region 116, and collector region 118. The emitter terminal is grounded while voltages are applied to the base and collector terminals. A current $I_e$ flows from ground to emitter 114 while current $I_c$ flows from collector 118 to an output circuit. A voltage $V_{be}$ exists between the emitter and the base, while a voltage $V_{ce}$ exists between the emitter and the collector.

FIG. 9 shows the $I_3$ versus $V_{be}$ characteristics of the grounded emitter structure of FIG. 8, while FIG. 10 shows the output characteristics of this structure. FIG. 10 plots collector current $I_c$ versus collector-emitter voltage $V_{ce}$, for the three values of base-emitter voltage shown in FIG. 9.

In FIG. 9, emitter current $I_e$ increases with increasing base-emitter voltage $V_{be}$ up to $V_{be} \simeq V_{be3}$. Base current $I_b$ is essentially zero since there is minimum recombination in the base region and minimum inverse injection of electrons from the base to the emitter.

In FIG. 10, the collector current $I_c$ does not change with the collector-emitter voltage $V_{ce}$ for each of the three sets of curves shown. This means that the output impedance of this structure is extremely high.

In contrast with an ordinary transistor where $I_c$ is plotted versus $V_{ce}$ for different values of emitter current $I_e$, FIG. 10 plots $I_c$ versus $V_{ce}$ for different values of $V_{be}$. Since the base current $I_b$ is approximately zero in the present device, the output characteristics are more like those which would be obtained with a field effect transistor. In the present device, it is the voltage on the emitter-base which controls the output characteristics, and not $I_e$.

What has been described is an extremely high speed semiconductor tunneling base device comprising very well-defined heterojunctions. This device has properties not heretofore achievable with prior semiconductor transistors. Of course, it will be obvious to those of skill in the art that modifications to the present device can be made to change or improve device performance, without departing from the principles of this invention. For example, it is possible to use a wide gap emitter both to increase the number of charge carriers which can tunnel through the base region and to prevent majority carriers in the base from moving to the emitter. Such wide gap emitters are known in the art, and their use in the present environment is merely a matter of design choice. Further, many semiconductor materials can be used for the various regions of the device, and the emitter and collector need not be of the same semiconductor material. Still further, while lattice matching is not absolutely essential to the practice of the present invention, it is important in providing very good interfaces between adjacent layers. If processes other than molecular beam epitaxy will provide good interfaces between semiconductor layers, then such other processes can also be readily used.

It is within the principles of this invention to vary the doping levels and crystallographic orientation of the semiconductors used for the various regions of the device. Using the principles of the present invention those of skill in the art may also design layered structures more complicated that the basic three layer n-p-n and p-n-p structures illustratively described herein. Further, the device can be used for many different purposes, including amplification, oscillation, and switching. Such uses and the biasing which would be required for such uses are within the skill of circuit designers.

What is claimed is:

1. A semiconductor device, comprising:
   first, second, and third semiconductor regions, said second region being in contact with and between said first and third regions and having a different composition and conductivity type than said first and third regions,
   biasing means for biasing semiconductor junctions formed between adjacent opposite conductivity type semiconductor regions in said device,
   said first and third regions having energy band gaps which are shifted due to the different composition in the same direction with respect to the energy band gap of said second region and overlap therewith to produce potential wells which substantially prevent majority carriers in said second region from going to said first and third regions, there being a band edge discontinuity between said first and second semiconductor regions which substantially prevents injection of charge carriers from said first region into said second region, where said second region is sufficiently thin that the dominant mechanism for charge carrier transfer from said first semiconductor region to said third semiconductor region is tunneling through said second region.

2. The device of claim 1, where said second region has a higher doping level than said first or third regions.

3. The device of claim 2, where the doping level in said second region is at least $10^{18}$ cm$^{-3}$.

4. The device of claim 1, where said semiconductor device has a first band edge discontinuity between said first and second regions which is a potential barrier to tunneling between said first and second regions, said device having a second band edge discontinuity between said second and third regions where said first and second band edge discontinuities are sufficiently great to substantially prevent majority carriers in said second region from going to said first or third regions.

5. The device of claim 1, where said first, second, and third regions are epitaxial layers, said second region having a thickness not in excess of about 100 Angstroms.

6. The device of claim 5, where the lattice mismatch between said epitaxial layers is not in excess of about 2.5%.

7. The device of claim 4, where said first band edge discontinuity is unequal to said second band edge discontinuity.

8. A semiconductor, high speed device comprising:
a semiconductor emitter region of a first conductivity type,
a semiconductor base region of a second conductivity type in contact with said emitter region and of sufficient thinness that the dominant charge transfer mechanism for transfer of charge carriers from said emitter to a collector region is tunneling through said base,
a semiconductor collector region of said first conductivity type in contact with said base region,
the doping level of said base region being greater than that of said emitter and collector regions,
where the junction between said base and emitter regions is a heterojunction and the junction between said base and collector regions is a heterojunction,
said emitter and collector regions having energy band gaps each of which is shifted due to the heterojunctions in the same direction with respect to the energy band gap of said base region, said emitter and collector band gaps overlapping with said base band gap,
an emitter-base band edge discontinuity which substantially prevents charge carrier injection from said emitter to said base.

9. The device of claim 8, where said base region has a doping level at least about $10^{18}$ cm$^{-3}$ and said emitter and collector regions have lower doping levels.

10. The device of claim 8, where the band edge discontinuity between the band gaps of said emitter, base, and collector regions produces a potential well for majority carriers in said base region which substantially prevents their movement from said base to said emitter and collector.

11. The device of claim 10, where said base region is less than about 100 Angstroms in thickness.

12. The device of claim 8, where the band edge discontinuity between said base and emitter regions is at least about 0.3 eV.

13. The device of claim 8, where the band edge discontinuity between said base and collector regions is at least about 0.3 eV.

14. The device of claim 8, where said emitter, base and collector regions are comprised of epitaxial layers having abrupt interfaces therebetween.

15. The device of claim 14, where the lattice mismatch between said epitaxial layers is less than about 2.5%.

16. The devicce of claim 8, where the transfer coefficient α for transfer of carriers from said emitter to said collector is approximately 1.

17. The device of claim 8, where said emitter and collector are comprised of the same semiconductor material.

18. The device of claim 8, wherein said emitter, base, and collector regions are comprised of semiconductor alloys.

19. The device of claim 18, where said base is comprised of an alloy of InGaAs and said emitter and collector regions are comprised of an alloy of GaSbAs.

20. The device of claim 18, where said alloys are ternary alloys.

21. The device of claim 18, where said base is comprised of an alloy of InAs and said emitter and collector are comprised of an alloy of GaSb.

22. A high speed semiconductor device, comprising:
a base-emitter heterojunction formed between semiconductor epitaxial base and emitter layers,
a base-collector heterojunction formed between said semiconductor epitaxial base layer and a semiconductor epitaxial collector layer,
where said base layer is sufficiently thin that charge carries from said emitter can tunnel through said base layer to reach said collector layer and said base layer is more highly conducting than said emitter or collector layers,
means for causing said charge carrier tunnneling,
means for providing a potential well between said base and emitter layers and between said base and collector layers to substantially prevent majority charge carries in said base from going to said emitter or collector layers, and
means for preventing charge carries in said emitter layer from being injected into said base layer for diffusion therein.

23. The device of claim 22, where said base layer has a conductivity level of at least about $10^{18}$ cm$^{-3}$.

24. The device of claim 23, where said emitter and collector layers have a conductivity level in the range of about $10^{16}$ cm$^{-3}$ to about $10^{17}$ cm$^{-3}$.

25. The device of claim 24, wherein said base layer is less than about 100 Angstroms in thickness.

26. The device of claim 25, where said base, emitter, and collector layers are essentially lattice matched to each other, the lattice mismatch between adjacent layers being less than about 2.5%.

27. The device of claim 22, where said emitter, base, and collector layers are comprised of semiconductor alloys.

28. The device of claim 22, where said emitter and collector layers are comprised of an alloy of GaSbAs and said base layer is comprised of an alloy of InGaAs.

29. The device of claim 22, where said emitter and collector layers are comprised of an alloy of GaSb and said base layer is comprised of an alloy of InAs.

30. The device of claim 26, where said emitter and collector layers are comprised of an alloy of GaSbAs and said base layer is comprised of an alloy of InGaAs.

31. The device of claim 26, where said emitter and collector layers are comprised of an alloy of GaSb and said base layer is comprised of an alloy of InAs.

32. A high speed semiconductor device, comprising: semiconductor emitter, base, and collector regions where the base-emitter junction and the base-collector junction are heterojunctions, said emitter and collector regions having opposite conductivity type than said base region,
said base being sufficiently thin that the dominant mechanism for transfer of charge carriers from said emitter to said collector is tunneling through said base,
there being a conduction band discontinuity $\Delta E_c$ between said emitter and base and between said base and collector and a valence band discontinuity $\Delta E_v$ between said emitter and said base and between said base and said collector, where $\Delta E_c$ and $\Delta E_v$ are in the same direction in an energy diagram of said device and the band gaps of said emitter and collector overlap with the band gap of the base, said band edge discontinuities between said emitter and said base substantially preventing injection of carriers from said emitter region into said base region.

33. The device of claim 32, where the doping level of the base region is greater than the doping level of the emitter region.

34. The device of claim 33, where said emitter, base, and collector are epitaxial layers.

35. The device of claim 33, wherein the doping level of the base is significantly greater than the doping levels of the emitter and the collector.

36. The device of claim 35, where said device is comprised of alloys of GaAsSb and InGaAs.

37. The device of claim 35, where said semiconductor materials are Si and GaP.

38. A high speed semiconductor device in which charge carriers move from a first semiconductor region of a first conductivity type to a third semiconductor region also having said first conductivity type by tunneling through an intermediate second semiconductor region of the opposite conductivity type, comprising:
first, second, and third semiconductor regions having heterojunctions formed between said first and second regions and between said second and third regions,
said second region being sufficiently thin that the dominant mechanism for transfer of charge carriers in said first region to said third region is tunneling through said second region,
the conductivity of said second region being greater than the conductivity of said first and third semiconductor regions,
said first, second, and third semiconductor regions having conduction band discontinuities and valence band discontinuities therebetween where the band discontinuities between the first and second regions are in a direction to substantially prevent charge carriers from being injected from said first region into said second region.

39. The device of claim 38, where said conduction band discontinuities and said valence band discontinuities are in the same direction in an energy diagram of said device, and where the energy band gaps of said first and third semiconductors are crossed with respect to the energy band gap of said second semiconductor region.

40. The device of claim 39, where said first, second, and third semiconductor regions are comprised of semiconductor layers having close lattice matching.

41. A high speed semiconductor device, comprising:
first, second, and third semiconductor regions where the dominant mechanism for movement of charge carriers from said first semiconductor region to said third semiconductor region is tunneling through said second semiconductor region, there being a heterojunction formed between said first and second regions, said second region having higher conductivity than said first region and being of opposite conductivity type of said first and third regions,
said second region being sufficiently thin that charge carriers in said first region can tunnel therethrough,
said first and second semiconductor regions having a conduction band discontinuity and a valence band discontinuity therebetween and overlapping band gaps where said discontinuities are in the same direction in the energy diagram of said device and substantially prevent injection of charge carriers from said first region into said second region.

42. The device of claim 41, where said first and second semiconductor regions are comprised of semiconductor materials having close lattice matching.

43. The device of claim 41, where said second and third semiconductor regions form a heterojunction therebetween, there being a conduction band discontinuity and valence band discontinuity between said second and third semiconductor regions, said discontinuities being in the same direction in the energy diagram of said device.

44. A high speed semiconductor device in which the dominant mechanism for charge carrier transfer from a first semiconductor region of a first conductivity type to a third semiconductor region of the same conductivity type is tunneling through a second semiconductor region, comprising:
first, second, and third semiconductor regions having a heterojunction formed between said first and second regions, where said second region is more heavily doped than said first region,
said second region being sufficiently thin that the dominant mechanism for charge carrier transfer from said first region to said third region is tunneling through said second region,
where either the conduction band edge or valence band edge, but not both, of said second semiconductor region lies within the energy band gap of said first semiconductor region, or is coincident with the conduction band edge or valence band edge of said first semiconductor region, there being a conduction band discontinuity and a valence band discontinuity between said first and second semiconductor regions providing means for substantially preventing injection of charge carriers from said first semiconductor region into said second semiconductor region.

* * * * *